US008928181B2

(12) United States Patent
Buschnakowski et al.

(10) Patent No.: US 8,928,181 B2
(45) Date of Patent: Jan. 6, 2015

(54) METHOD AND APPARATUS FOR TRANSMISSION OF ENERGY AND DATA

(75) Inventors: Stephan Buschnakowski, Chemnitz (DE); Torsten Pechstein, Radebeul (DE); Sven-Matthias Scheibe, Dresden (DE)

(73) Assignee: Endress + Hauser Conducta Gesellschaft fur Mess- und Regeltechnik mbH + Co. KG, Gerlingen (DE)

( * ) Notice: Subject to any disclaimer, the term of this patent is extended or adjusted under 35 U.S.C. 154(b) by 790 days.

(21) Appl. No.: 12/733,406

(22) PCT Filed: Aug. 12, 2008

(86) PCT No.: PCT/EP2008/060575
§ 371 (c)(1),
(2), (4) Date: Jul. 12, 2010

(87) PCT Pub. No.: WO2009/027222
PCT Pub. Date: Mar. 5, 2009

(65) Prior Publication Data
US 2010/0283327 A1  Nov. 11, 2010

(30) Foreign Application Priority Data

Aug. 30, 2007 (DE) .................. 10 2007 041 237

(51) Int. Cl.
*H02J 17/00* (2006.01)
*H03F 1/00* (2006.01)
*H03F 1/02* (2006.01)
*H03F 3/217* (2006.01)
*H04L 25/02* (2006.01)

(52) U.S. Cl.
CPC ............ *H03F 3/2176* (2013.01); *H03F 1/0238* (2013.01); *H04L 25/0266* (2013.01); *H03F 2200/541* (2013.01); *H03F 2200/321* (2013.01); *H03F 1/0211* (2013.01)
USPC ................. 307/104; 363/15; 363/16; 363/17; 363/20; 363/97

(58) Field of Classification Search
CPC .................................. H02J 17/00; H02F 1/00
USPC ...................... 307/104, 91; 607/61, 32, 33, 10
See application file for complete search history.

(56) References Cited

U.S. PATENT DOCUMENTS 4,480,178 A * 10/1984 Miller et al. .................. 235/380
4,797,541 A * 1/1989 Billings et al. ................ 235/449
(Continued)

FOREIGN PATENT DOCUMENTS

| DE | 196 21 003 A1 | 11/1997 |
| DE | 197 19 730 C1 | 10/1998 |
| DE | 102 00 488 A1 | 7/2003 |
| EP | 1 377 105 A2 | 1/2004 |
| GB | 2 404 094 A | 1/2005 |
| WO | WO 2009/027222 A1 | 3/2009 |

OTHER PUBLICATIONS

G. Wang and G. Kendir, "Design and Analysis of an Adaptive Transcutaneous Power Telemetry for Biomedical Implants", IEEE Transactions on Circuits and Systems, Part I, New York, 2005.
Zierhofer, C.M. Ed, "A Class-E Tuned Power Oscillator for Inductive Transmission of Digital Data and Power", Electrotechnical Conference, 1991, New York.

*Primary Examiner* — Rexford Barnie
*Assistant Examiner* — Toan Vu
(74) *Attorney, Agent, or Firm* — Bacon & Thomas, PLLC

(57) ABSTRACT

In a method and in an apparatus for transmission of energy and data, with a primary side, on which an amplifier is arranged, with a secondary side, on which a data source, e.g. a measuring sensor, is arranged, and with a plug-together assembly inductively coupling, galvanically completely isolated, the primary side and the secondary side, to minimize power losses and disturbing influences of fluctuating parameters, power from the plug-together assembly and from the amplifier, preferably a Class-E-amplifier, is controlled to a predeterminable, desired value. For this, a microcontroller taps the primary voltage on the primary winding and produces for the amplifier a controlled operating voltage as well as a controlled operating frequency, in order to keep the working point of the amplifier always in the optimal region.

8 Claims, 1 Drawing Sheet

(56) References Cited

U.S. PATENT DOCUMENTS

| | | |
|---|---|---|
| 5,325,046 A | 6/1994 | Young et al. |
| 7,245,888 B2 * | 7/2007 | Sointula .................... 455/127.1 |
| 7,252,565 B2 | 8/2007 | Hunter |
| 7,769,466 B2 * | 8/2010 | Denker et al. ................. 607/61 |
| 2004/0130425 A1 | 7/2004 | Dayan |
| 2007/0290749 A1 * | 12/2007 | Woo et al. ..................... 330/149 |
| 2008/0036588 A1 * | 2/2008 | Iverson et al. ........... 340/539.17 |

* cited by examiner

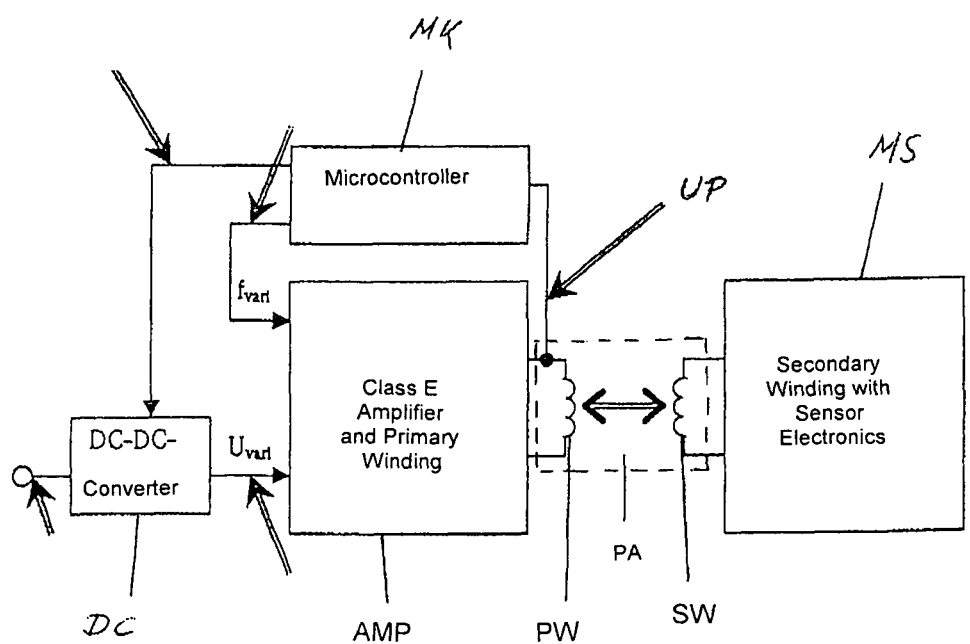

METHOD AND APPARATUS FOR TRANSMISSION OF ENERGY AND DATA

TECHNICAL FIELD

The invention relates to a method for transmission of energy and data, wherein a primary side with an amplifier and a secondary side with a data source are provided, wherein the amplifier and the data source are inductively coupled, galvanically completely isolated, by means of a plug-together assembly, wherein energy is inductively transmitted from the amplifier to the data source on the secondary side, and data are transmitted in the opposing direction from the data source inductively unidirectionally to the amplifier and, in given cases, also bidirectionally from the amplifier to the data source.

The invention relates further to an apparatus for transmission of energy and data, wherein a primary side with an amplifier and a secondary side with a data source are provided, wherein the amplifier and the data source are inductively coupled, galvanically completely isolated, by means of a plug-together assembly, wherein energy is inductively transmittable from the amplifier to the data source on the secondary side, and data are transmittable in the opposing direction from the data source inductively unidirectionally to the amplifier and, in given cases, also bidirectionally from the amplifier to the data source.

BACKGROUND DISCUSSION

Such methods and apparatuses for transmission of both energy as well as also data are equipped e.g. in measurement installations for the measuring of physical variables, such as e.g. pH-value. Serving as data source is a measuring sensor. In such measurement installations, a primary side with an amplifier and a secondary side with a measuring sensor are provided, which are inductively coupled with one another by means of a galvanically completely isolated, plug-together assembly. Galvanic isolation is required in explosion-endangered areas.

Known from EP 0 980 603 B1 for the transmission of energy and data is a plugged connection suitable for a measurement installation in explosion-endangered areas. For improving the transmission characteristics, the primary side and optionally also the secondary side is/are equipped with a transceiver, which besides performing the transmitting and receiving functions can also serve as an amplifier.

A weak point of such apparatuses is the plugged connection, because different cable and measuring sensors, as well as, in given cases, mechanical tolerances and environmental influences can bring about variable power transmission.

SUMMARY OF THE INVENTION

It is, consequently, an object of the invention, to provide a method and an apparatus for the transmission of energy and data, that the effects of variable power transmission are minimized.

Methodwise, this object is achieved by controlling the power drawn by the plugged connection and the data source.

Apparatuswise, this object is achieved by providing that the power drawn by the plugged connection and the data source is controllable.

Through the feature of the invention, wherein the power drawn by the plugged connection and the data source, e.g. a measuring sensor, is controlled to a desired value, not only are power losses minimized and production of reactive power prevented, but also influences of all types of disturbing parameter are compensated. The amplifier, especially a class E-amplifier, lies, therefore, always in, or near, the resonance point, so that reactive power fractions are minimized. Irrespective of this, the frequency of the amplifier can be varied for purposes of amplitude, or frequency, modulation, or shift keying.

The power control can occur, for example, through control of the operating frequency and/or the operating voltage (preferably both) on the primary side in a simple, yet very effective, manner.

An example of an embodiment of the invention provides that the operating frequency and the operating voltage of the amplifier, preferably of a Class-E amplifier, is controlled by means of a microcontroller as a function of the primary voltage on the primary winding. The working point of the amplifier remains, in the case of the invention, not fixed, but, instead, is always brought into the optimal position, more exactly in, or near, the resonance point, in order, largely, to prevent, or to minimize, reactive power fractions.

When the data source, e.g. a measuring sensor, receives too little energy, it shows this by sending a so-called undervoltage bit to the microcontroller, which immediately readjusts the voltage.

In an additional example of an embodiment of the invention, the microcontroller controls a DC-DC converter for producing the operating voltage for the amplifier.

In another example of an embodiment of the invention, a digital sensor is provided as the measuring sensor.

The invention can be applied in an advantageous manner e.g. in a measurement installation for measuring pH-value in explosion-endangered areas. It is, however, in no way limited to such application. The invention can be applied advantageously anywhere where, besides energy transmission, also data exchange occurs, be such data exchange unidirectional or bidirectional.

BRIEF DESCRIPTION OF THE DRAWINGS

The invention will now be described and explained in greater detail on the basis of the drawing, the sole FIGURE of which shows as follows:

FIG. 1 is a block diagram of an example of an embodiment of the invention.

DETAILED DISCUSSION IN CONJUNCTION WITH THE DRAWING

Connected to the output of a Class-E amplifier AMP is a primary winding PW. The associated secondary winding SW is connected to a combined input and output of a measuring sensor MS. The primary winding PW and the secondary winding SW are arranged in a plug-together assembly PA. A microcontroller MK receives the primary voltage UP from the primary winding PW and produces and controls, as a function of this primary voltage UP, the operating frequency $f_{vari}$ and the operating voltage $U_{vari}$ for the amplifier AMP. Furthermore, the microcontroller MK controls a DC-DC converter DC, which delivers the controlled operating voltage $U_{vari}$ for the amplifier AMP. Lying on the input of the DC-DC converter DC is a voltage delivered by a measured value transmitter. The microcontroller MK uses error messages received from the measuring sensor MS and readjusts the operating frequency $f_{vari}$ and the operating voltage $U_{vari}$ for the Class-E amplifier AMP, until the error messages from the measuring sensor MS disappear. The invention is especially suitable for signals coded by means of amplitude shift keying.

Translation of German Words and/or Symbols in the Drawing FIG. 1:
Change "V" to --AMP--;
change "PS" to --PW--;
change "SS" to --SW--;
change "SK" to --PA--;
change "Mikrokontroller" to --Microcontroller--;
change "Wandler" to --Converter--;
change "Klasse E Verstärker and Primärspule" to --Class E Amplifier and Primary Winding--; and
change "Sekundärspule mit Sensorelektronik" to --Secondary Winding with Sensor Electronics--.

The invention claimed is:

1. A method for the transmission of energy and data, wherein a primary side with an amplifier with a connected primary winding and a secondary side with a data source are provided, wherein said data source is a digital sensor with a connected secondary winding, comprising the steps of:
   inductively coupling, galvanically completely isolating the amplifier and the data source by means of a plug-together assembly;
   inductively transmitting energy from the amplifier to the data source on the secondary side, and inductively transmitting data in the opposing direction from the data source to the amplifier;
   controlling the power drawn by the plug-together assembly and the data source by means of a microcontroller, wherein said microcontroller is situated on the primary side;
   controlling the operating frequency for the amplifier by means of the microcontroller as a function of primary voltage on said primary winding; and
   controlling the operating voltage for the amplifier by means of the microcontroller as a function of the primary voltage on said primary winding,
   wherein said microcontroller receives said primary voltage from said primary winding and produces and controls, as a function of the primary voltage, said operating frequency and said operating voltage for said amplifier,
   wherein said microcontroller controls a DC-DC converter for producing said controlled operating voltage for said amplifier,
   wherein on the input of said DC-DC converter lies a voltage delivered by a measured value transmitter,
   wherein said amplifier is a Class-E amplifier,
   wherein connected to the output of said Class-E amplifier is said primary winding,
   wherein said secondary winding is connected to a combined input and output of the digital sensor, and
   wherein said primary winding and said secondary winding are arranged in said plug-together assembly.

2. The method as claimed in claim 1, wherein: the microcontroller supplies the amplifier with the operating frequency.

3. The method as claimed in claim 1, wherein: the method is provided in a measurement installation for measuring physical variables.

4. The method as claimed in claim 1, wherein: supplementally, inductive data transmission occurs from the primary side to the secondary side.

5. An apparatus for the transmission of energy and data, comprising:
   a primary side with an amplifier with a connected primary winding and a secondary side with a data source, wherein said data source is a digital sensor with a connected secondary winding;
   a microcontroller, wherein said microcontroller is situated on the primary side; and
   a plug-together assembly, wherein:
   said amplifier and said data source are inductively coupled, galvanically completely isolated by said plug-together assembly;
   energy is inductively transmittable from the amplifier to the data source on the secondary side and data are inductively transmittable in the opposing direction from the data source to the amplifier;
   power drawn by said plug-together assembly and said data source is controllable by means of said microcontroller;
   the operating frequency for said amplifier is controllable by means of said microcontroller as a function of primary voltage on said primary winding;
   the operating voltage for said amplifier is controllable by means of said microcontroller as a function of the primary voltage on said primary winding;
   wherein said microcontroller receives said primary voltage from said primary winding and produces and controls, as a function of the primary voltage, said operating frequency and said operating voltage for said amplifier,
   wherein a DC-DC converter is operable by means of said microcontroller for producing said controlled operating voltage for said amplifier,
   wherein on the input of said DC-DC converter lies a voltage delivered by a measured value transmitter,
   wherein said amplifier is a Class-E amplifier,
   wherein connected to the output of said Class-E amplifier is said primary winding,
   wherein said secondary winding is connected to a combined input and output of the digital sensor, and
   wherein said primary winding and said secondary winding are arranged in said plug-together assembly.

6. The apparatus as claimed in claim 5, wherein: said amplifier is suppliable with the operating frequency by means of said microcontroller.

7. The apparatus as claimed in claim 5, wherein: the apparatus is provided in a measurement installation for measuring physical variables.

8. The apparatus as claimed in claim 5, wherein: supplementally, inductive data transmission is provided from said primary side to said secondary side.

* * * * *